(12) United States Patent
Utsunomiya et al.

(10) Patent No.: US 6,713,815 B2
(45) Date of Patent: Mar. 30, 2004

(54) SEMICONDUCTOR DEVICE WITH TRANSISTORS THAT CONVERT A VOLTAGE DIFFERENCE INTO A DRAIN CURRENT DIFFERENCE

(75) Inventors: Fumiyasu Utsunomiya, Chiba (JP); Hirokazu Yoshizawa, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/147,415

(22) Filed: May 16, 2002

(65) Prior Publication Data

US 2002/0175373 A1 Nov. 28, 2002

(30) Foreign Application Priority Data

May 17, 2001 (JP) ........................................ 2001-147919
May 8, 2002 (JP) ........................................ 2002-133036

(51) Int. Cl.[7] ............................................. H01L 23/62
(52) U.S. Cl. ..................... 257/347; 257/229; 257/509
(58) Field of Search .............................. 257/229, 230, 257/360, 516, 509, 204, 347

(56) References Cited

U.S. PATENT DOCUMENTS 6,512,252 B1 * 1/2003 Takagi et al. ............... 257/192
6,552,407 B1 * 4/2003 Hayashi et al. ............. 257/507
6,570,226 B1 * 5/2003 Groeseneken et al. ...... 257/361
6,603,511 B1 * 8/2003 Ishida ......................... 348/294

* cited by examiner

*Primary Examiner*—John B. Vigashin
*Assistant Examiner*—Lourdes Cruz
(74) *Attorney, Agent, or Firm*—Adams & Wilks

(57) ABSTRACT

A semiconductor device is provided, which includes a pair of differential transistors that convert a voltage difference between a first input terminal and a second input terminal into a drain current difference between a first transistor and a second transistor and in which a voltage range of the first input terminal or the second input terminal is wide. A SOI structure MOSFET is used as each of the pair of differential transistors. The MOSFET includes a general MOSFET structure including a source region, a drain region, a well region between both the regions, a gate oxide film on an upper surface of the well region, and a gate electrode on the gate oxide film, and further includes a first conductivity type substrate region under the source region, the drain region and the well region through a buried oxide film. In the MOSFET, the first conductivity type substrate region of the first transistor is the first input terminal, and the first conductivity type substrate region of the second transistor is the first input terminal.

16 Claims, 4 Drawing Sheets

# SEMICONDUCTOR DEVICE WITH TRANSISTORS THAT CONVERT A VOLTAGE DIFFERENCE INTO A DRAIN CURRENT DIFFERENCE

BACKGROUND OF THE INVENTION

1. Field of the Invention

The present invention relates to a semiconductor device including a first input terminal, a second input terminal, and a first transistor and a second transistor arranged as a pair of differential transistors that convert a voltage difference between the first input terminal and the second input terminal into a drain current difference between the first transistor and the second transistor.

2. Description of the Related Art

FIGS. 2A and 2B are schematic circuit diagrams that show the vicinity of a pair of differential transistors in a conventional semiconductor device that includes a first transistor having a first input terminal, a second transistor having a second input terminal, and the pair of differential transistors that convert a voltage difference between the first input terminal and the second input terminal into a drain current difference between the first transistor and the second transistor. FIG. 2A shows a case where the pair of differential transistors are p-channel type MOSFETs (hereinafter abbreviated to PMOS). FIG. 2B shows a case where the pair of differential transistors are n-channel type MOSFETs (hereinafter abbreviated to NMOS).

First, FIG. 2A is described. A power source terminal 101, to which a power source voltage Vdd that is higher than a voltage at a GND terminal is input, and a constant current source 102 that flows a constant current Ic are arranged in series. One terminal of the constant current source 102 is connected to a source region of a first PMOS 110 and a source region of a second PMOS 111. Further, a substrate of the first PMOS 110 is provided with a first input terminal 104 to which a voltage V1 is input, and a drain region of the first PMOS 110 is provided with a first drain terminal 107. A substrate of the second PMOS 111 is provided with a second input terminal 105 to which a voltage V2 is input, and a drain region of the second PMOS 111 is provided with a second drain terminal 108. Gates of the first PMOS 110 and the second PMOS, 111 are provided with a gate voltage input terminal 106 to which a common gate voltage Vg is input.

In the constant current source 102, a terminal on the current inflow side is connected with the power source terminal 101, and a terminal on the current outflow side is connected with a common node 103. In the first PMOS 110, the source region is connected with the common node 103, the drain region is connected with the first drain terminal 107, a gate electrode is connected with the gate electrode input terminal 106, and a well region is connected with the first input terminal 104. In the second PMOS 111, the source region is connected with the common node 103, the drain region is connected with the second drain terminal 108, the gate electrode is connected with the gate voltage input terminal 106, and the well region is connected with the second input terminal 105. In general, the first PMOS 110 and the second PMOS 111 are of exactly the same structure, and, in the case where the first PMOS 110 and the second PMOS 111 are turned on and the voltage V1 is equal to the voltage V2, the voltages at the respective terminals are set such that a current Id1 that flows out from the first drain terminal 107 and a current Id2 that flows out from the second drain terminal 108 are equal to each other. Thus, a voltage difference ΔV between the voltage V1 and the voltage V2 is converted into a threshold voltage difference between the first PMOS 110 and the second PMOS 111 which arises from a difference in back gate effect. Further, the threshold voltage difference is converted into a current difference ΔId between the current Id1 and the current Id2.

Therefore, the back gate effect of the first PMOS 110 and the second PMOS 111 occurs even when the voltage V1 and the voltage V2 are in the vicinity of the power source voltage Vdd. Thus, a function of converting the voltage difference ΔV into the current difference ΔId is provided even when the voltage V1 and the voltage V2 are in the vicinity of the power source voltage Vdd.

Next, FIG. 2B is described. As shown in FIG. 2B, the structure is composed of a GND terminal 109, the constant current source 102 that flows the constant current Ic, a first NMOS 112, a second NMOS 113, the first input terminal 104 to which the voltage V1 is input, the second input terminal 105 to which the voltage V2 is input, the first drain terminal 107, the second drain terminal 108, and the gate voltage input terminal 106 to which the gate voltage Vg is input. In the constant current source 102, the terminal on the current inflow side is connected with the common node 103, and the terminal on the current outflow side is connected with the GND terminal 109. In the first NMOS 112, the source region is connected with the common node 103, the drain region is connected with the first drain terminal 107, the gate electrode is connected with the gate voltage input terminal 106, and the well region is connected with the first input terminal 104. In the second NMOS 113, the source region is connected with the common node 103, the drain region is connected with the second drain terminal 108, the gate electrode is connected with the gate voltage input terminal 106, and the well region is connected with the second input terminal 105. In general, the first NMOS 112 and the second NMOS 113 are of exactly the same structure, and, in the case where the first NMOS 112 and the second NMOS 113 are turned on and the voltage V1 is equal to the voltage V2, the voltages at the respective terminals are set such that the current Id1 that flows out from the first drain terminal 107 and the current Id2 that flows out from the second drain terminal 108 are equal to each other. Thus, the voltage difference ΔV between the voltage V1 and the voltage V2 is converted into the threshold voltage difference between the first NMOS 112 and the second NMOS 113 which arises from the difference in back gate effect. Further, the threshold voltage difference is converted into the current difference ΔId between the current Id1 and the current Id2.

Therefore, the back gate effect of the first NMOS 112 and the second NMOS 113 occurs even when the voltage V1 and the voltage V2 are in the vicinity of the voltage of the GND terminal. Thus, the function of converting the voltage difference ΔV into the current difference ΔId is provided even when the voltage V1 and the voltage V2 are in the vicinity of the voltage of the GND terminal.

That is, a differential amplifier circuit or the like which adopts the structure of the vicinity of the pair of differential transistors shown in FIG. 2A and in which the current difference ΔId is used to amplify the voltage difference ΔV when input voltages are the voltage V1 and the voltage V2 can effect its function even when the input voltages are in the vicinity of the power source voltage Vdd. Also, a differential amplifier circuit or the like which adopts the structure of the vicinity of the pair of differential transistors shown in FIG. 2B and in which the current difference ΔId is used to amplify the voltage difference ΔV when input voltages are the voltage V1 and the voltage V2 can effect its function even when the input voltages are in the vicinity of the voltage at the GND terminal.

The above-described structure of the vicinity of the pair of differential transistors in the differential amplifier circuit or the like in the conventional semiconductor device has had a problem in that the voltage V1 or the voltage V2, which is the input voltage, can be used only until it becomes a voltage at which a forward direction of a PN junction constituted of the source region and the well region of the PMOS or NMOS that is the differential transistor is turned on.

For example, in the case where the structure of the vicinity of the pair of differential transistors shown in FIG. 2A is adopted for the differential amplifier circuit, the voltage V1 or the voltage V2, which is the input voltage, can not be used when the input voltage is equal to or lower than the voltage at which a forward direction of a PN junction constituted of the source region that is a p-type semiconductor and the well region that is an n-type semiconductor of the first PMOS 110 or the second PMOS 111 is turned on. This is because the current of the constant current source 102 flows out to the first input terminal 104 or the second input terminal 105, and thus, the current Id1 or the current Id2 decreases or vanishes. Therefore, an operation speed of the differential amplifier circuit decreases or the differential amplifier circuit does not operate, and also, the voltage at the first input terminal 104 or the second input terminal 105 fluctuates.

Also, in the case where the structure of the vicinity of the pair of differential transistors shown in FIG. 2B is adopted, the voltage V1 or the voltage V2, which is the input voltage, can not be used when the input voltage is equal to or higher than the voltage at which a forward direction of a PN junction constituted of the source region that is an n-type semiconductor and the well region that is a p-type semiconductor of the first NMOS 112 or the second NMOS 113 is turned on. This is because the current flows into the constant current source 102 from the first input terminal 104 or the second input terminal 105 when the input voltage is the above-described voltage or more, and thus, the current Id1 or the current Id2 decreases or vanishes. Therefore, the operation speed of the differential amplifier circuit decreases or the differential amplifier circuit does not operate, and also, the voltage at the first input terminal 104 or the second input terminal 105 fluctuates.

SUMMARY OF THE INVENTION

The present invention has been made in view of the above, and an object of the present invention is therefore to provide a semiconductor device, including a first input terminal, a second input terminal, and a first transistor and a second transistor comprising a pair of differential transistors that a convert a voltage difference between the first input terminal and the second input terminal into a drain current difference between the first transistor and the second transistor, wherein the first transistor and the second transistor have a MOSFET structure including a source region, a drain region, a well region between the source and drain regions, a gate oxide film on an upper surface of the well region, a gate electrode on the gate oxide film, a first conductivity type substrate regions provided under the source region, the drain region, and the well region through a buried oxide film, the first conductivity type substrate region of the first transistor being the first input terminal, and the first conductivity type substrate region of the second transistor being the second input terminal. Accordingly, the first input terminal and the second input terminal are completely insulated from the source region, the drain region, and the well region. Thus, an input voltage range of the first input terminal or the second input terminal can be remarkably widened.

DETAILED DESCRIPTION OF THE PREFERRED EMBODIMENTS

Hereinafter, embodiments of the present invention will be described with the accompanying drawings.

Figure 1A:
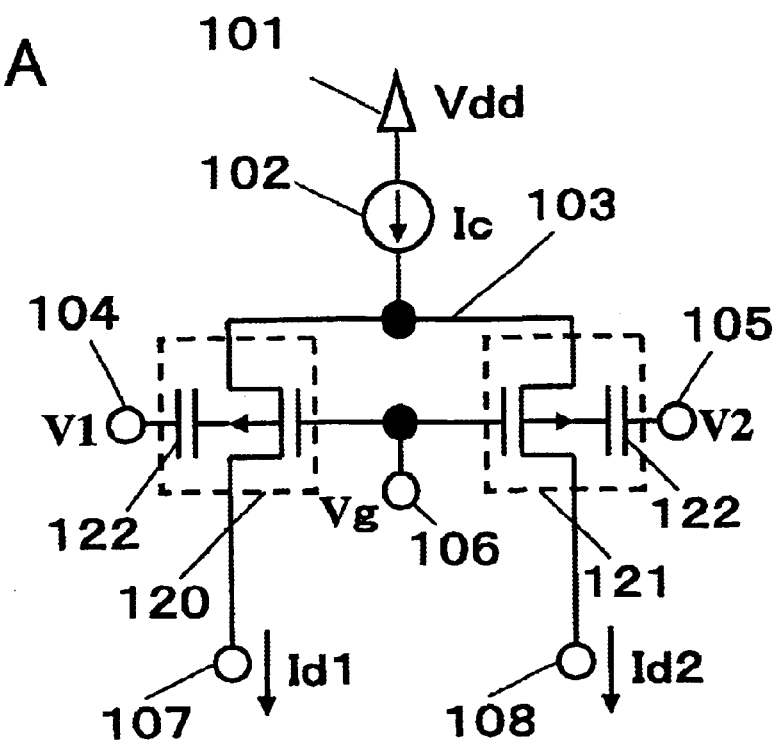
FIGS. 1A and 1B are schematic circuit diagrams that show the vicinity of a pair of differential transistors in a semiconductor device in accordance with a first embodiment of the present invention.
Figure 1B:
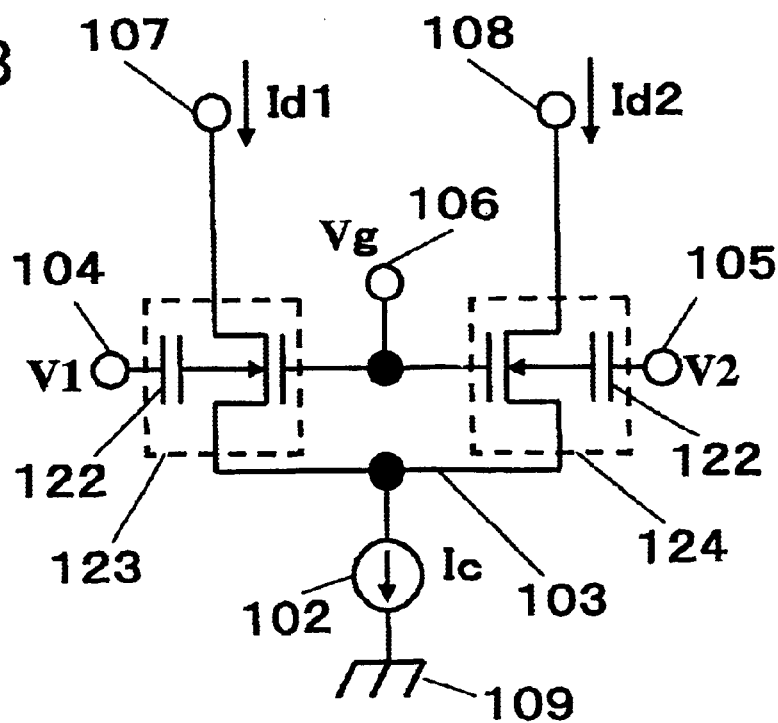
Figure 2A:
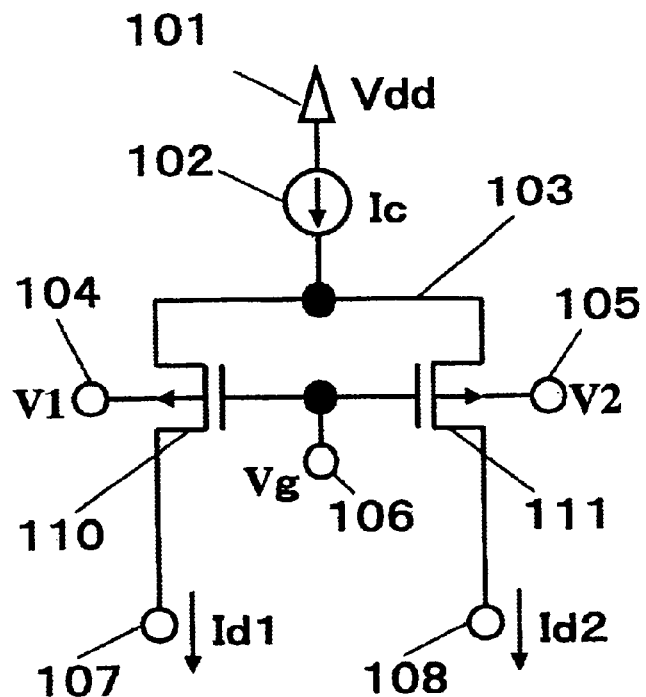
FIGS. 2A and 2B are schematic circuit diagrams that show the vicinity of a pair of differential transistors in a conventional semiconductor device.
Figure 2B:
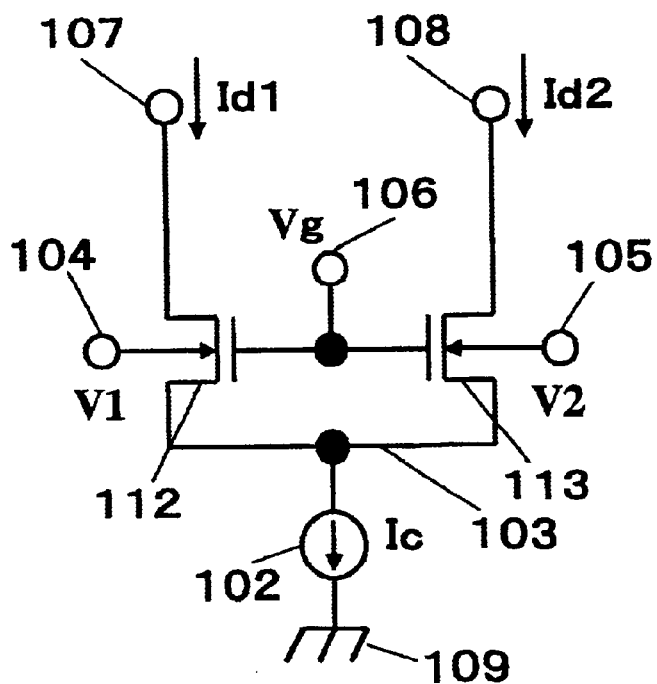

FIGS. 1A and 1B are schematic circuit diagrams that show the vicinity of a pair of differential transistors in a differential amplifier circuit in a semiconductor device in accordance with a first embodiment of the present invention. FIG. 1A is a schematic circuit diagram in the case where the pair of differential transistors are SOI structure p-channel type MOSFETs (hereinafter abbreviated to SOIPMOS). FIG. 1B is a schematic circuit diagram in the case where the pair of differential transistors are SOI structure n-channel type MOSFETs (hereinafter abbreviated to SOINMOS).

Figure 3:
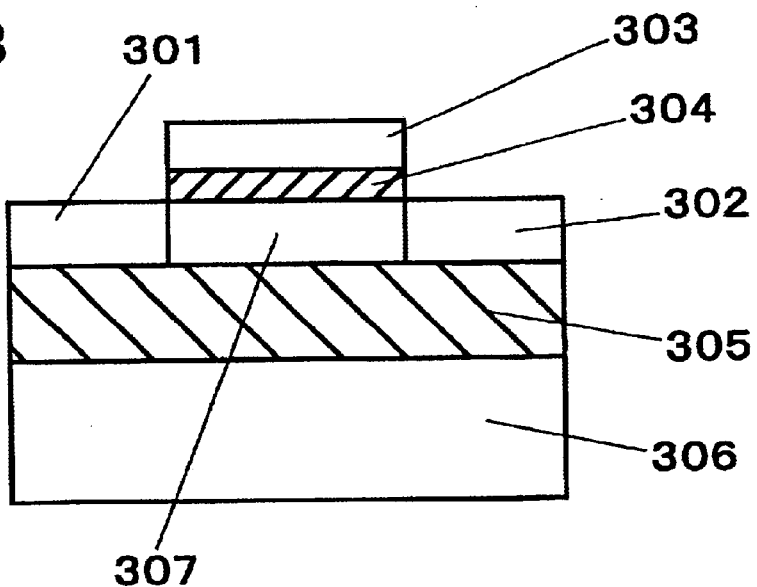
FIG. 3 is a schematic sectional view of a SOI structure MOS used in the pair of differential transistors in the semiconductor device in accordance with the embodiment of the present invention.

FIG. 3 is a schematic sectional view of the SOIPMOS or SOINMOS used in FIG. 1A or 1B. As shown in FIG. 3, the SOIPMOS or SOINMOS has a gate electrode 303, a gate oxide film 304, a source region 301, a drain region 302, a well region 307, a buried oxide film 305 and a first conductivity type substrate region 306. The buried oxide film 305 is on the first conductivity type substrate region 306, and the source region 301 and the drain region 302 are on the buried oxide film 305. Further, the well region 307 is between the source region 301 and the drain region 302, the gate oxide film 304 is on the entire well region 307, and the gate electrode 303 is on the entire gate oxide film 304.

Accordingly, the first conductivity type substrate region 306 has the same function as the gate electrode 303, and the buried oxide film 305 has the same function as the gate oxide film 304. Thus, the effect obtained by varying the voltage of the gate electrode 303 can also be obtained by varying the voltage of the first conductivity type substrate region 306. For example, in the SOIPMOS, in the case where the voltage of the gate electrode 303 and the voltage of the source region 301 are made equal to each other and the voltage of the drain region 302 is lower than the voltage of the source region 301, when the voltage of the first conductivity type substrate region 306 is gradually decreased so as to be lower than the voltage of the source region 301, a lower channel is formed in the well region 307 in the vicinity of an interface of the buried oxide film 305 and the well region 307 at a certain point, a current flows between the source region 301 and the drain region 302, and then, the current increases along with the decrease of the voltage of the first conductivity type substrate region 306, which is a series of MOSFET operation. Further, the case where the well region 307 is thin in the state that the lower channel has not been formed is described. Namely, in the case where a lower depletion layer that extends to the well region 307 from the interface of the buried oxide film 305 and the well region 307 exists, along with the decrease in the voltage of the first conductivity type substrate region 306 to a voltage lower than the voltage of the source region 301, and overlaps an upper depletion layer that extends to the well region 307 from the interface of the gate oxide film 304 and the well region 307 along with the decrease in the voltage of the gate electrode 303 to a voltage lower than the voltage of the source region 301. On the contrary, in the case where an accumulation layer that extends to the well region 307 from the interface of the buried oxide film 305 and the well region 307 along with the rise of the voltage of the first conductivity type substrate region 306 to a voltage higher than the voltage of the source region 301, and overlaps the upper depletion layer, the voltage of the first conductivity type substrate region 306 is fluctuated, whereby an effect similar to the back gate effect of the conventional PMOS can be obtained in which the threshold voltage of the PMOS with the gate electrode 303 as the gate electrode fluctuates.

That is, as described above, in the SOIPMOS, the drain current that flows between the source region 301 and the drain region 302 through the lower channel fluctuates due to the voltage of the first conductivity type substrate region 306, or, in the case where the lower channel has not formed, the threshold voltage of the PMOS with the gate electrode 303 as the gate electrode fluctuates due to the voltage of the first conductivity type substrate region 306, and thereby the drain current that flows between the source region 301 and the drain region 302 of the PMOS fluctuates. This is utilized, whereby there can be obtained the same effect as in the drain current fluctuation due to the back gate effect of the conventional PMOS. In addition, in the case where the back gate effect of the conventional PMOS is utilized, there occurs a phenomenon in which a PN junction of the source region 301 and the well region 307 is turned on depending on the potential of the well region. However, in the case of the SOIPMOS, the above phenomenon does not occur since the first conductivity type substrate region 306 is insulated from the source region 301, the drain region 302 and the well region 307 by the buried oxide film 305.

Incidentally, the description of the SOINMOS is omitted for simplicity purposes, but it will be appreciated that the above-described effect can be obtained by reversing the potential relationship between the respective regions and the gate electrode 303 in the case of the SOIPMOS. Further, as to the potential of the well region 307, in the case of a complete depletion type SOI structure, it may not require the potential, but in the case where the region has the potential or the case of a partial depletion type SOI structure, it is recommended that the well region 307 has the same potential as the source region 301 or that the well region 307 has a potential with such an extent that the PN junction constituted of the source region 301 and the well region 307 is not turned on.

Subsequently, there will be described the case where the SOIPMOS or SOINMOS having the above-described structure and feature is adopted for the pair of differential transistors.

First, FIG. 1A is described. As shown in FIG. 1A, the structure includes the power source terminal 101 to which the power source voltage Vdd higher than that at the GND terminal is input, the constant current source 102 that flows the constant current Ic, a first SOIPMOS 120, a second SOIPMOS 121, the first input terminal 104 to which the voltage V1 is input, the second input terminal 105 to which the voltage V2 is input, the first drain terminal 107, the second drain terminal 108, and the gate voltage input terminal 106 to which the gate voltage Vg is input. In the constant current source 102, the terminal on the current inflow side is connected with the power source terminal 101, and the terminal on the current outflow side is connected with the common node 103. In the first SOIPMOS 120, the source region is connected with the common node 103, the drain region is connected with the first drain terminal 107, the gate electrode is connected with the gate voltage input terminal 106, and the first conductivity type substrate region is connected with the first input terminal 104. In the second SOIPMOS 121, the source region is connected with the common node 103, the drain region is connected with the second drain terminal 108, the gate electrode is connected with the gate voltage input terminal 106, and the first conductivity type substrate region is connected with the second input terminal 105. In general, the first SOIPMOS 120 and the second SOIPMOS 121 are of exactly the same structure, and, in the case where the first SOIPMOS 120 and the second SOIPMOS 121 are turned on and the voltage V1 is equal to the voltage V2, the voltages at the respective terminals are set such that the current Id1 that flows out from the first drain terminal 107 and the current Id2 that flows out from the second drain terminal 108 are equal to each other. Thus, the voltage difference ΔV between the voltage V1 and the voltage V2 is converted into the threshold voltage difference between the first SOIPMOS 120 and the second SOIPMOS 121 which arises from the difference in influence of the potential imparted to the first conductivity type substrate region. Further, the threshold voltage difference is converted into the current difference ΔId between the current Id1 and the current Id2. Incidentally, a capacitance 122 in each of the first SOIPMOS 120 and the second SOIPMOS 121 indicates a capacitance constituted of the first conductivity type substrate region, the buried oxide film as an insulating film, and the well region. The capacitance 122 is provided in order to express that the potential of the first conductivity type substrate region influences the well region through the buried oxide film.

As described above, the pair of differential transistors shown in FIG. 1A is adopted for a differential amplifier circuit or the like, whereby the threshold voltage difference is generated due to the difference in influence of the potential imparted to the first conductivity type substrate region in each of the first SOIPMOS 120 and the second SOIPMOS 121 even when the voltage V1 and the voltage V2 in FIG. 1A are in vicinity of the power source voltage Vdd. Thus, even when the voltage V1 and the voltage V2 are in the vicinity of the power source voltage Vdd, the voltage difference ΔV can be converted into the current difference ΔId. In addition, the problem is solved in that the structure of the conventional pair of differential transistors does not provide its function when the voltage V1 or the voltage V2 is the voltage at which the PN junction of the well region and the source region is turned on.

Next, FIG. 1B is described. As shown in FIG. 1B, the structure includes the GND terminal 109, the constant current source 102 that flows the constant current Ic, a first SOINMOS 123, a second SOINMOS 124, the first input terminal 104 to which the voltage V1 is input, the second input terminal 105 to which the voltage V2 is input, the first drain terminal 107, the second drain terminal 108, and the gate voltage input terminal 106 to which the gate voltage Vg is input. In the constant current source 102, the terminal on the current inflow side is connected with the common node 103, and the terminal on the current outflow side is connected with the GND terminal 109. In the first SOINMOS 123, the source region is connected with the common node 103, the drain region is connected with the first drain terminal 107, the gate electrode is connected with the gate voltage input terminal 106, and the first conductivity type substrate region is connected with the first input terminal 104. In the second SOINMOS 124, the source region is connected with the common node 103, the drain region is connected with the second drain terminal 108, the gate electrode is connected with the gate voltage input terminal 106, and the first conductivity type substrate region is connected with the second input terminal 105. In general, the first SOINMOS 123 and the second SOINMOS 124 are of exactly the same structure, and, in the case where the first SOINMOS 123 and the second SOINMOS 124 are turned on and the voltage V1 is equal to the voltage V2, the voltages at the respective terminals are set such that the current Id1 that flows out from the first drain terminal 107 and the current Id2 that flows out from the second drain terminal 108 are equal to each other. Thus, the voltage difference ΔV between the voltage V1 and the voltage V2 is converted into the threshold voltage difference between the first SOINMOS 123 and the second SOINMOS 124 which arises from the difference in influence of the potential imparted to the first conductivity type substrate region. Further, the threshold voltage difference is converted into the current difference ΔId between the current Id1 and the current Id2.

Therefore, the difference in influence of the potential imparted to the first conductivity type substrate region between the first SOINMOS 123 and the second SOINMOS 124 is generated even when the voltage V1 and the voltage V2 are in the vicinity of the voltage at the GND terminal 109. Thus, a function of converting the voltage difference ΔV into the current difference ΔId is provided even when the voltage V1 and the voltage V2 are in the vicinity of the voltage at the GND terminal 109. Incidentally, the capacitance 122 in each of the first SOINMOS 123 and the second SOINMOS 124 indicates a capacitance constituted of the first conductivity type substrate region, the buried oxide film as an insulating film, and the well region. The capacitance 122 is provided in order to express that the potential of the first conductivity type substrate region influences the well region through the buried oxide film.

As described above, the structure of the pair of differential transistors shown in FIG. 1B is adopted for the differential amplifier circuit or the like, whereby the threshold voltage difference is generated due to the difference in influence of the potential imparted to the first conductivity type substrate region in each of the first SOINMOS 123 and the second SOINMOS 124 even when the voltage V1 and the voltage V2 in FIG. 1B are in the vicinity of the voltage at the GND terminal. Thus, even when the voltage V1 and the voltage V2 are in the vicinity of the voltage at the GND terminal, the voltage difference ΔV can be converted into the current difference ΔId. In addition, the problem is solved in that the structure of the conventional pair of differential transistors does not provide its function when the voltage V1 or the voltage V2 is the voltage at which the PN junction of the well region and the source region is turned on.

Both the pairs of differential transistors shown in FIGS. 1A and 1B each realize the function as long as the voltage at the first input terminal or the second input terminal is equal to or lower than the voltage at which the buried oxide film or the like is broken down. However, in the case where the buried oxide film is made thin and the effect of converting the voltage difference ΔV into the current difference ΔId is increased, the lower channel may be formed in the range of the voltage which is input to the first input terminal or the second input terminal. That is, the degree of the effect of converting the voltage difference ΔV into the current difference ΔId may have an inflection point. When this case is avoided, in the case where the voltage input to the first input terminal or the second input terminal is in the vicinity of the power source voltage Vdd, the structure shown in FIG. 1A is adopted, and in the case where the voltage is in the vicinity of the voltage at the GND terminal, the structure shown in FIG. 1B is adopted. Accordingly, the circuit in the vicinity of the pair of differential transistors can be designed in which the formation of the lower channel can be suppressed as much as possible and the effect of converting the voltage difference ΔV into the current difference ΔId is large. Further, the differential amplifier circuit that utilizes the circuit in the vicinity of the pair of differential transistors is used, whereby a comparator or operational amplifier with high gain can be designed.

Figure 4:
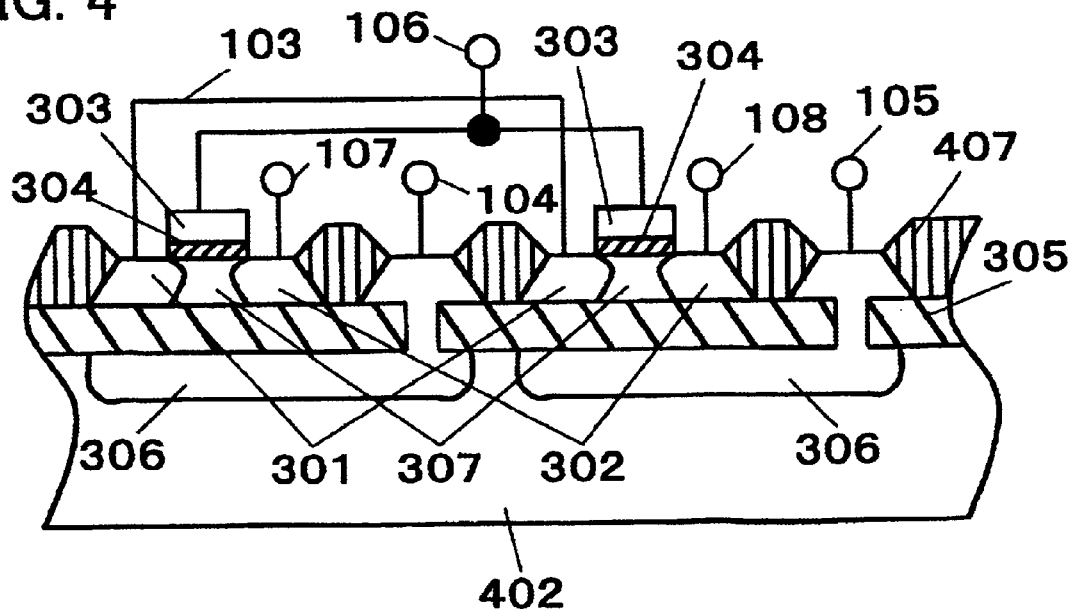
FIG. 4 is a schematic sectional view in the case where a pair of differential transistors in a semiconductor device in accordance with a second embodiment of the present invention are formed on a wafer having a SOI structure.

FIG. 4 is a schematic sectional view in the case where the pair of differential transistors shown in FIG. 1A or 1B are formed on a wafer having a SOI structure. As shown in FIG. 4, a first conductivity type substrate region 306 of each transistor is provided to a part of an interface of a second conductivity type substrate region 402 and a buried oxide film 305 positioned thereon. On each of the first conductivity type substrate region 306, a source region 301, a drain region 302, and a well region 307 between both the regions of each transistor are provided through the buried oxide film 305. Further, a gate oxide film 304 is provided on the well region 307 of each transistor, and a gate electrode 303 is provided on the gate oxide film 304. A LOCOS oxide film 407 that contacts the buried oxide film 305 is provided to the opposing surface to the surface of the source region 301 or the drain region 302 of each transistor, which contacts the well region 307. The first conductivity type substrate region 306 of each transistor penetrates a part of the buried oxide film 305 positioned on the first conductivity type substrate region 306 in an upper direction. The first conductivity type substrate region 306 that penetrates the buried oxide film 305 is surrounded by the LOCOS oxide film 407. The portion of the first conductivity type substrate region which penetrates the buried oxide film 305 in each transistor is connected to the fist input terminal 104 or the second input terminal 105. Moreover, in each transistor, the drain region 302 is connected to the first drain terminal 107 or the second drain terminal 108, the source region 301 is connected to the common node 103, and the gate electrode 303 is connected to the gate voltage input terminal 106.

Incidentally, in the case where the second conductivity type substrate region 402 is of p-type, the first conductivity type substrate region 306 is of n-type. Further in this case, the voltage of the second conductivity type substrate region 402 is set to the voltage at which a PN junction constituted of both the substrate regions is not turned on even when the voltage input to the first input terminal 104 or the second input terminal 105 is the lowest voltage. In the case where the second conductivity type substrate region 402 is of n-type, the first conductivity type substrate region 306 is of p-type. Further in this case, the voltage of the second conductivity type substrate region 402 is set to the voltage at which a PN junction constituted of both the substrate regions is not turned on even when the voltage input to the first input terminal 104 or the second input terminal 105 is the highest voltage. In addition, although only the schematic sectional view of the pair of differential transistors is shown in FIG. 4, needles to say, transistors in other circuits can attain low consumption and high speed by being formed on the SOI structure wafer on which the pair of differential transistors are formed.

Figure 5A:
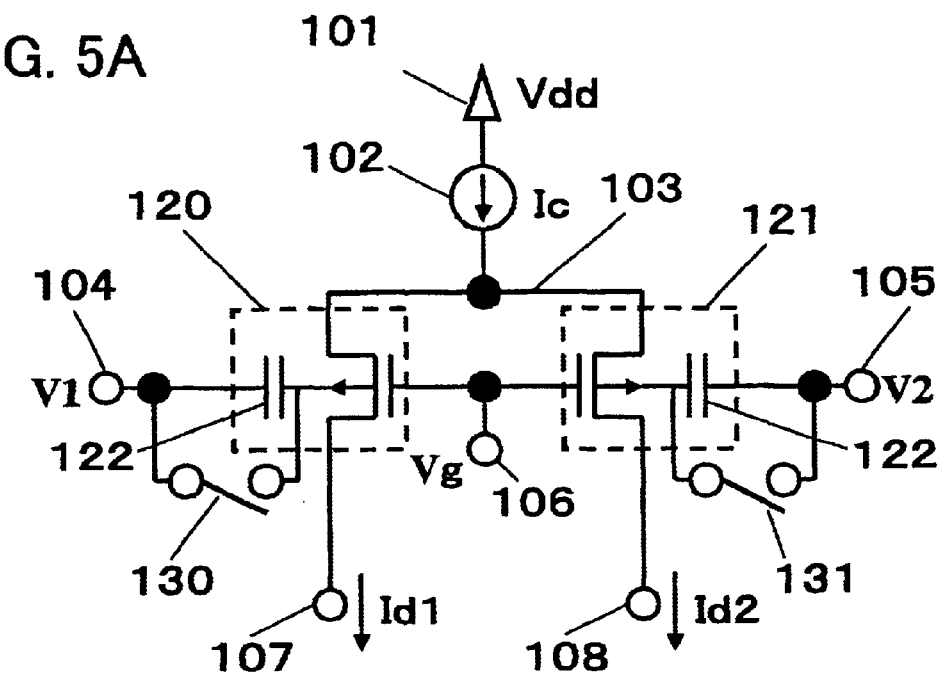
FIGS. 5A and 5B are schematic circuit diagrams that show the vicinity of the pair of differential transistors in the semiconductor device in accordance with the second embodiment of the present invention.
Figure 5B:
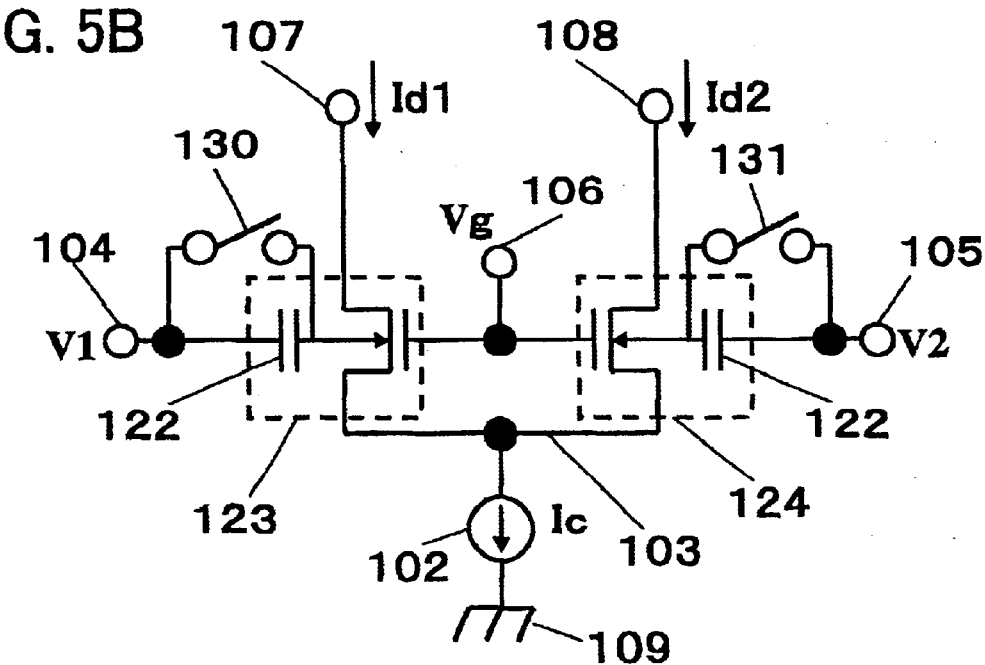

Further, FIGS. 5A and 5B are schematic circuit diagrams of the vicinity of a pair of differential transistors in a differential amplifier circuit in a semiconductor device in accordance with a second embodiment of the present invention. FIG. 5A is a schematic circuit diagram in the case where the pair of differential transistors are the SOIPMOSs, and FIG. 5B is a schematic circuit diagram in the case where the pair of differential transistors are the SOINMOSs.

As shown in FIG. 5A or 5B, a first switch 130 and a second switch 131 each having a switching function are added to the structure of the vicinity of the pair of differential transistors shown in FIG. 1A or 1B, and the well region and the first conductivity type substrate region of each differential transistor are connected through the first switch 130 or the second switch 131.

With the above structure, in the case where the above switching element is turned on, the voltage V1 or the voltage V2 in FIGS. 5A and 5B is input to the well region of each differential transistor. Thus, the threshold voltage fluctuation of each pair of differential transistors with respect to the fluctuation of the voltage V1 or the voltage V2 can be increased in comparison with each pair of differential transistors in FIGS. 1A and 1B or FIGS. 2A and 2B. That is, the ΔId that is the difference between the current Id1 and the current Id2 in FIGS. 5A and 5B with respect to the voltage difference ΔV between the voltage V1 and the voltage V2 in FIGS. 5A and 5B is larger than that in FIGS. 1A and 1B or FIGS. 2A and 2B.

On the other hand, in the case where the voltage V1 or the voltage V2 in FIGS. 5A and 5B is in the range of the voltage at which a forward direction of a PN junction constituted of the well region and the source region of each differential transistor is turned on, the above-described problem similar to that in the conventional case arises. Therefore, the switching elements are turned off, whereby the above problem can be solved.

Accordingly, the circuit structure in the vicinity of the pair of differential transistors in FIG. 5A or 5B is adopted for a differential amplifier circuit, whereby the characteristic in the case where the structure in FIG. 1A or 1B is adopted for the differential amplifier circuit is obtained, and additionally, an amplification factor of the differential amplifier circuit can be increased in the region where the forward direction of the PN junction constituted of the well region and the source region of each differential transistor is not turned on.

As described above, the comparator circuit, operational amplifier or the like is designed by using the differential amplifier circuit which adopts the structure of the vicinity of the pair of differential transistors according to the present invention, whereby the voltage in the wider range than that in the conventional comparator circuit, operational amplifier or the like can be compared or amplified. As a result, performance of the semiconductor device mounted with the comparator circuit, operational amplifier or the like can be improved.

According to the present invention, the range of the voltage which can be compared or amplified by a comparator circuit, operational amplifier or the like that uses pair of differential transistors in a semiconductor device can be improved, whereby the performance of the semiconductor device can be improved.

What is claimed is:

1. A semiconductor device, comprising: a first input terminal; a second input terminal; and a differential transistor pair comprised of a first transistor and a second transistor for converting a voltage difference between the first input terminal and the second input terminal into a drain current difference between the first transistor and the second transistor, the first transistor and the second transistor each having a source region, a drain region, a well region disposed between the source and drain regions, a gate oxide film provided on an upper surface of the well region, a gate electrode provided on the gate oxide film, a buried oxide film provided under the source region, the drain region, and the well region, and a first conductivity type substrate region provided under the buried oxide film, the first conductivity type substrate region of the first transistor being the first input terminal and the first conductivity type substrate region of the second transistor being the second input terminal.

2. A semiconductor device according to claim 1; wherein gate electrodes of the first transistor and the second transistor are connected to a common gate voltage input terminal.

3. A semiconductor device according to claim 2; wherein source regions or the first transistor and the second transistor are connected to a common source terminal.

4. A semiconductor device according to claim 3; wherein the common source terminal is connected to a power source voltage via a constant current source.

5. A semiconductor device according to claim 4; wherein a constant current produced by the constant current source flows from the power source voltage to the common source terminal.

6. A semiconductor device according to claim 3; wherein the common source terminal is connected to ground potential via a constant current source.

7. A semiconductor device according to claim 6; wherein a constant current produced by the constant current source flows from the common source terminal to ground.

8. A semiconductor device according to claim 1; wherein the first and second transistors are SOI transistors.

9. A semiconductor device according to claim 8; wherein the first and second transistors are MOS transistors.

10. A differential amplifier comprising: a first input terminal; a second input terminal; and a differential transistor pair comprised of a first SOI MOS transistor and a second SOI MOS transistor each comprised of a substrate, an insulator film provided on the substrate, source and drain regions provided on the insulator film, a well region disposed between the source and drain regions, a gate insulator provided on the well region and a gate electrode provided on the gate insulator; wherein the substrate of the first SOI MOS transistor is connected to the first input terminal and the substrate of the second SOI MOS transistor is connected to the second input terminal so that a voltage difference between the first input terminal and the second input terminal is converted into a drain current difference between the first SOI MOS transistor and the second SOI MOS transistor.

11. A differential amplifier according to claim 10; wherein the gate electrodes of the first and second SOI MOS transistors are connected to a common gate terminal.

12. A differential amplifier to claim 11; wherein source regions of the first SOI MOS transistor and the second SOI MOS transistor are connected to a common source terminal.

13. A differential amplifier according to claim 12; wherein the common source terminal is connected to a power source voltage via a constant current source.

14. A differential amplifier according to claim 13; wherein a constant current produced by the constant current source flows from the power source voltage to the common source terminal.

15. A differential amplifier according to claim 12; wherein the common source terminal is connected to ground potential via a constant current source.

16. A differential amplifier according to claim 15; wherein a constant current produced by the constant current source flows from the common source terminal to ground.

* * * * *